United States Patent [19]

Marumo et al.

[11] Patent Number: 5,160,961
[45] Date of Patent: Nov. 3, 1992

[54] SUBSTRATE HOLDING DEVICE

[75] Inventors: Mitsuji Marumo, Sagamihara; Kazunori Iwamoto, Yokohama; Nobutoshi Mizusawa, Yamato; Takao Kariya; Shunichi Uzawa, both of Tokyo, all of Japan

[73] Assignee: Canon Kabushiki Kaisha, Tokyo, Japan

[21] Appl. No.: 672,636

[22] Filed: Mar. 20, 1991

[30] Foreign Application Priority Data

Mar. 23, 1990 [JP] Japan .................. 2-071886

[51] Int. Cl.5 .................................... G03B 27/42
[52] U.S. Cl. ............................. 355/53; 355/73
[58] Field of Search ........................ 355/53, 73

[56] References Cited

U.S. PATENT DOCUMENTS

| 4,282,924 | 8/1981 | Faretra ............... 165/80 |
| 4,757,355 | 7/1988 | Iizuka et al. ........... 355/53 |
| 4,820,930 | 4/1989 | Tsutsui et al. ......... 250/548 |
| 4,854,444 | 8/1989 | Iwamoto .............. 198/750 |
| 4,999,506 | 3/1991 | Mizusawa et al. ...... 250/491.1 |
| 5,008,703 | 4/1991 | Kawakami et al. ...... 355/53 |

FOREIGN PATENT DOCUMENTS

| 0134621 | 3/1985 | European Pat. Off. |
| 0312924 | 4/1989 | European Pat. Off. |
| 0357424 | 3/1990 | European Pat. Off. |
| 243519 | 9/1989 | Japan . |

Primary Examiner—Monroe H. Hayes
Attorney, Agent, or Firm—Fitzpatrick, Cella, Harper & Scinto

[57] ABSTRACT

A device for holding a substrate includes a holding system for holding a substrate by attraction and a guard system for preventing dropping of the substrate held by the holding system, the guard system being out of contact with the substrate as the same is held by the holding system.

19 Claims, 6 Drawing Sheets

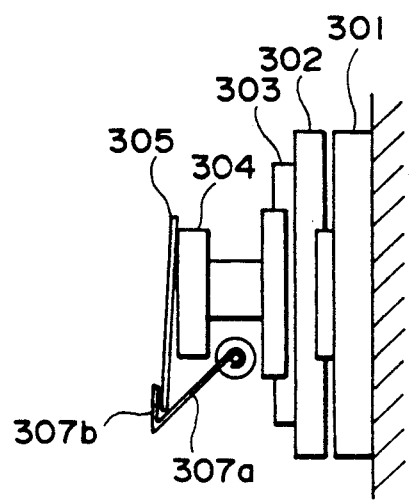
F I G. 4C
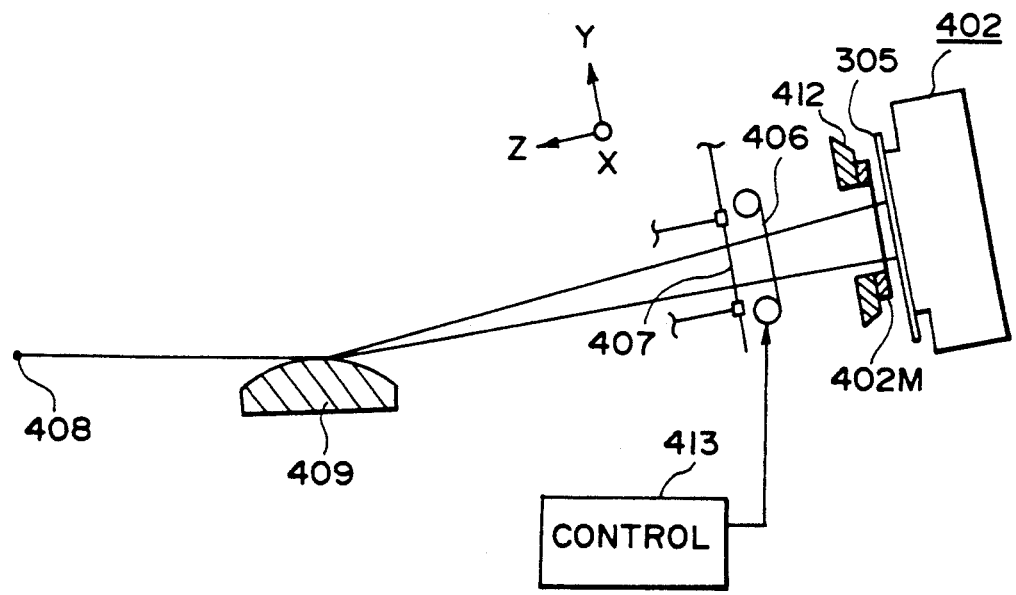
F I G. 4D

SUBSTRATE HOLDING DEVICE

FIELD OF THE INVENTION AND RELATED ART

This invention relates to a substrate holding device, and more particularly, to a substrate holding device which is suitably usable, e.g., in an exposure apparatus for transferring and printing an image of an original such as a mask onto a substrate, to be exposed, such as a semiconductor wafer very precisely, as a wafer hand mechanism for transporting the semiconductor wafer or as a wafer chuck mechanism for holding the semiconductor wafer, for example.

With recent increasing degrees of integration of semiconductor integrated circuits, in an exposure apparatus (aligner) for manufacture of the same, further enhancement of transfer precision is required. As an example, for an integrated circuit of 256 megabit DRAM, an exposure apparatus capable of printing a pattern of a linewidth on the order of 0.25 microns is necessary.

As such a super-fine pattern printing exposure apparatus, an exposure apparatus which uses orbit radiation light (SOR X-rays) has been proposed.

The orbit radiation light has a sheet beam shape, uniform in a horizontal direction. Thus, for exposure of a plane of a certain area, many proposals have been made, such as follows:

(1) Scan exposure method wherein a mask and a wafer are moved in a vertical direction whereby the surface is scanned with X-rays of sheet beam shape in a horizontal direction;

(2) Scan mirror exposure method wherein X-rays of sheet beam shape are reflected by an oscillating mirror whereby a mask and a wafer are scanned in a vertical direction; and (3) Simultaneous exposure method wherein X-rays of sheet beam shape in a horizontal direction are diverged in a vertical direction by an X-ray mirror having a reflection surface machined into a convex shape, whereby an exposure region as a whole is irradiated simultaneously.

The inventors of the subject application have cooperated to devise such a simultaneous exposure type X-ray exposure apparatus, which is disclosed in Japanese Laid-Open Patent Application No. 243519/1989.

In such an SOR X-ray exposure apparatus, an SOR X-ray bundle (SOR beam) emanates from an SOR device substantially horizontally and, to meet this, usually an original and a substrate to be exposed are held substantially vertically during the exposure period. Because a substrate or the like is held substantially vertically during the exposure period, at many stages during the transportation it is held substantially vertically. This causes such an inconvenience that a substrate or the like held by vacuum attraction, for example, during the normal operation period falls off and is damaged due to failure in attraction caused by electric surface interruption, malfunction of a sensor for wafer transfer, degraded flatness of the substrate, or the like, and scattered fractions of the substrate damage various units constituting the exposure apparatus.

SUMMARY OF THE INVENTION

It is a primary object of the present invention to provide an arrangement, in a substrate holding device usable, e.g., in an exposure apparatus wherein exposure or transportation of a substrate to be exposed is effected while holding the substrate upright, which arrangement is effective to prevent fall-off of the substrate which otherwise results from electric surface interruption, malfunction of a sensor or insufficient flatness of the substrate, to thereby prevent creation of foreign particles by the fall-off or damage of the exposure apparatus by fractions of the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1C are schematic representations of a wafer hand mechanism according to a first embodiment of the present invention, wherein FIGS. 1A and 1B are top plan views, respectively, and FIG. 1C is a side view.

FIGS. 4A–4D show a major part of an exposure apparatus according to another aspect of the present invention, wherein FIG. 4A is a front view, FIGS. 4B and 4C are side views, and FIG. 4D is a top plan view.

DESCRIPTION OF THE PREFERRED EMBODIMENTS

Figure 1A:
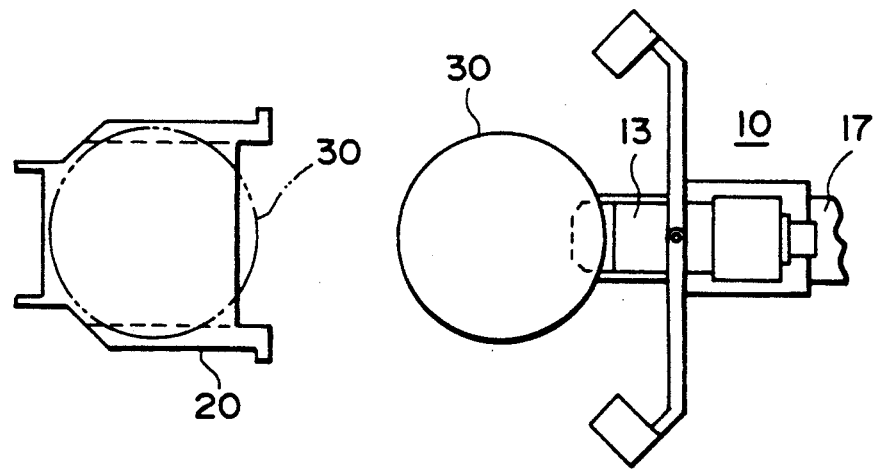
Figure 1B:
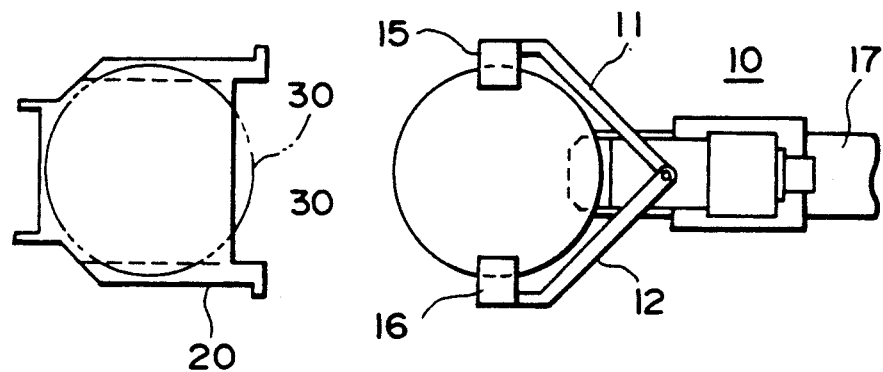
Figure 1C:
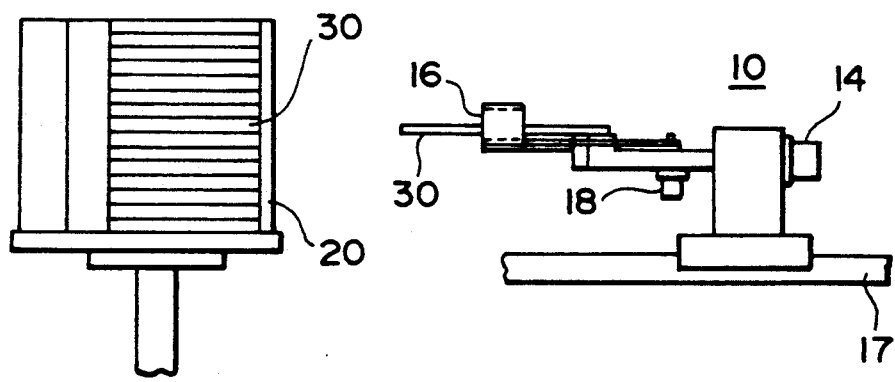

FIGS. 1A–1C show the structure of a wafer hand mechanism according to the present invention. FIG. 1A is a top plan view showing a state in which wafer fall-off preventing arms are retracted. FIG. 1B is a top plan view showing a state in which the arms are moved to their operative positions. FIG. 1C is a side view corresponding to FIG. 1B.

Wafer hand 10 shown in these drawings serves to take out a wafer 30 from a wafer carrier 20 to transfer it to a separate conveying means (not shown) or it serves to move a wafer 30, received from separate conveying means, back into the wafer carrier 20. This wafer hand has a similar structure as that of a conventional wafer hand, for holding a wafer by vacuum attraction and for conveying the same, except that it is provided with fall-off preventing arms 11 and 12 as well as an actuator 18 such as a motor, for example, for moving the fall-off preventing arms 11 and 12 between a fall-off preventing position (as illustrated in FIG. 1B) and a retracted position (as illustrated in FIG. 1A) in accordance with the presence/absence of the wafer 30. The fall-off preventing arms 11 and 12 are arranged to be maintained out of contact with a wafer 30 during a normal period. Denoted at 13 is an attraction arm, denoted at 14 is a rotational shaft, denoted at 15 and 16 are fall-off preventing pawls, and denoted at 17 is a guide for guiding the wafer hand horizontally as viewed in the drawings.

In the above-described structure, when a wafer 30 is to be taken out of the wafer carrier 20, first the height of the wafer carrier 20 is adjusted so that the attraction arm 13 comes slightly lower than the wafer 30 which is going to be taken out. Subsequently, while holding the fall-off preventing arms 11 and 12 in an open state as shown in FIG. 1A, the wafer hand 10 is moved from the right to the left as viewed in the drawing until the free end portion of the attraction arm 13 comes underneath the bottom of the wafer 30. Then, the attraction arm 13 is lifted slightly so as to take the wafer 30 off the wafer carrier 20, and the wafer 30 is held by the arm through vacuum attraction. Then, the wafer hand 10 is moved rightwardly to the position shown in FIG. 1A and, after this, the fall-off preventing arms 11 and 12 are closed such as shown in FIGS. 1B and 1C. When this is accomplished and when the wafer hand 10 is rotated by 90 degrees about the shaft 14 by means of a motor (not shown) so as to place the wafer upright, with the wafer surface being placed vertically, even if the wafer 30 is going to fall as a result of electric service interruption, malfunction of a vacuum system (not shown), insufficient flatness of the wafer or the like, the wafer 30 is supported by the pawls 15 and 16 of the fall-off preventing arms 11 and 12. In this manner, the fall-off of the wafer from the wafer hand 10 is prevented. Except for the period of wafer transfer between the wafer hand and the wafer carrier, the arms 11 and 12 may be held closed as desired, for example, when a wafer is held on the wafer hand with the wafer surface being placed horizontally.

Moving the wafer 30 back into the wafer carrier 20 may be made in the reverse order as described.

An unshown controller and an unshown position sensor of well-known type may be used to execute the above-described operation, while monitoring the position of the wafer hand through the position sensor and under the control of the controller.

In the example described above, when the wafer hand is at a position effective to take a wafer 30 out of the wafer carrier 20 (the wafer is placed horizontally), the fall-off preventing arms 11 and 12 are held at their retracted positions while, on the other hand, when the wafer hand is at a position for conveying the wafer 30 in its upright state, the fall-off preventing arms 11 and 12 are moved to their fall-off preventing positions. That is, the controller (not shown) operates in response to the position of the wafer hand 10 to project or retract the pawls 15 and 16. However, in place of such projection/-retraction control of the pawls 15 and 16 responsive to the position of the hand 10, the projection/retraction of the pawls 15 and 16 may be controlled in response to the attitude or state (e.g. operative or not) of the hand 10, to be described below.

Figure 2A:
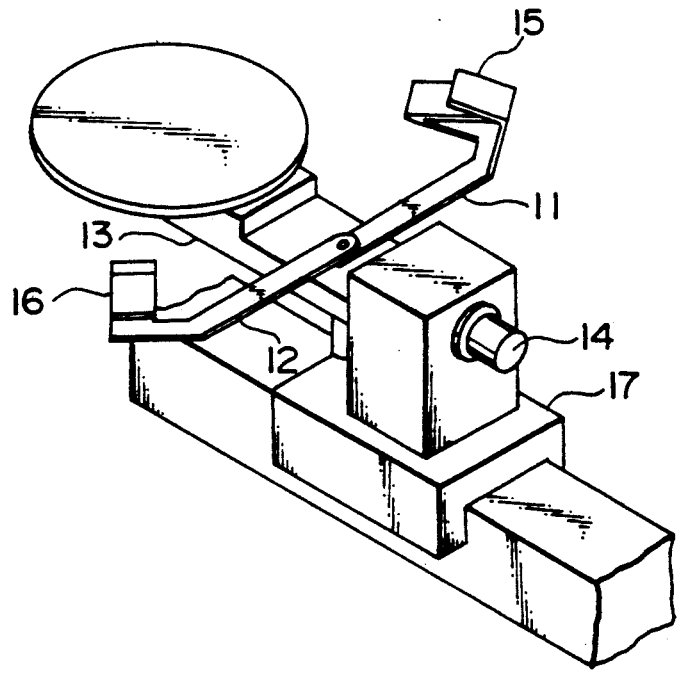
FIGS. 2A and 2B are perspective views, respectively, of a wafer hand mechanism according to a second embodiment of the present invention.
Figure 2B:
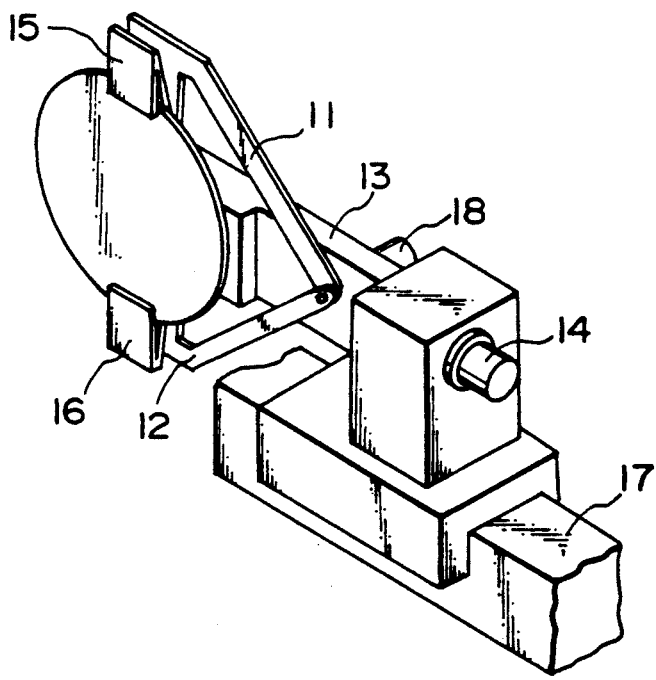

FIGS. 2A and 2B show an embodiment wherein the pawls 15 and 16 are controlled in response to the attitude of the wafer hand 10. More specifically, when the wafer hand 10 is moved into an attitude to hold the wafer 30 horizontally (laterally), in response to this movement the pawls 15 and 16 are retracted such as shown in FIG. 2A. On the other hand, when the wafer hand is moved into an attitude to hold the wafer 30 vertically, in response to this movement the pawls 15 and 16 are protruded such as shown in FIG. 2B. This may be done under sequence control. An attitude sensor of known type may be provided on the wafer hand so that, on the basis of an output of such attitude sensor, a controller (not shown) may control the operation described above.

As shown in FIGS. 1A-1C, in place of sequence control for the projection/retraction of the pawls 15 and 16, the presence/absence of a wafer may be detected and the projection/retraction of the pawls 15 and 16 may be controlled in accordance with the result of the detection.

Figure 3:
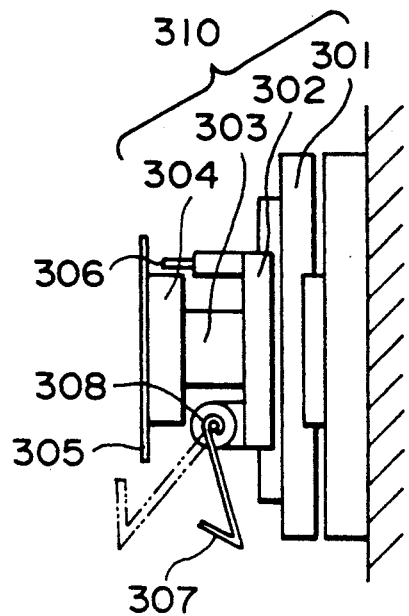
FIG. 3 is a side view of a wafer chuck according to another aspect of the present invention.

FIG. 3 shows a wafer chuck according to an aspect of the present invention. In this embodiment, as described hereinbefore, the presence/absence of a wafer is detected to control projection/retraction of the pawls.

Denoted in FIG. 3 at 301 is an X stage; at 302 is a Y stage; at 303 is a 0 stage; at 304 is a wafer chuck; and at 305 is a wafer. Here, the X stage 301, the Y stage 302, the 0 stage 303 and the wafer chuck 304 constitute a wafer stage 310 which itself is of a known type. However, the wafer stage 310 is provided with an electrostatic sensor 306 for detecting presence/absence of a wafer 305 as well as a pawl 307 which is adapted to be projected/retracted in response to an output from the electrostatic sensor 306. FIG. 3 shows a state in which the pawl 307 is retracted (solid line position). When the pawl 307 is projected, it takes a position as depicted by a broken line. Denoted at 308 is a motor (actuator) for projecting/retracting the pawl 307. The result of the detection by the electrostatic sensor 306 is monitored by a controller (not shown). If the absence (fall-off) of the wafer 305 on the wafer chuck 304 is detected by the sensor 306, the controller operates instantaneously to drive the motor 308 to project the pawl 307 to its fall-off preventing position (broken line position in FIG. 3).

Figure 4A:
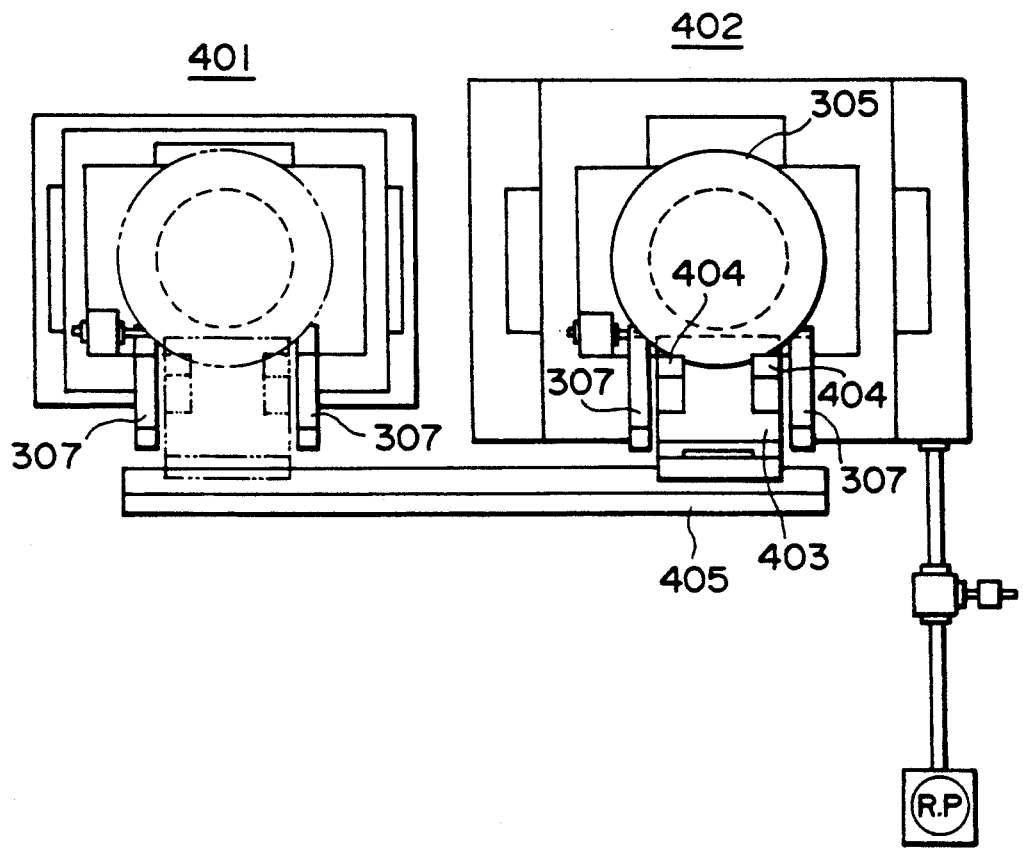
Figure 4B:
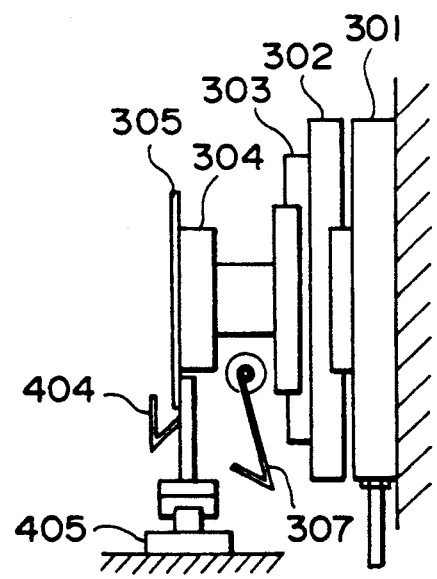

FIGS. 4A-4D show a wafer chuck and a wafer hand according to another embodiment of the present invention. FIG. 4A is a front view and FIGS. 4B and 4C are side views. FIG. 4D is a top plan view showing details of an exposing portion of an exposure apparatus into which the wafer chuck and the wafer hand of this embodiment are incorporated.

Denoted in these drawings at 401 is a prealignment stage for relatively roughly positioning a wafer; at 402 is an exposure stage; at 402M is a wafer on which a pattern to be transferred to the wafer with X-rays is formed; at 412 is a mask chuck for holding the mask 402M; and at 403 is a wafer hand. The wafer hand 403 serves to convey the wafer 305, having been relatively roughly positioned at the prealignment stage 401, from this prealignment stage to the exposure stage 402 while holding the wafer 305 upright. Denoted at 404 are pawls of the wafer hand 403, and denoted at 405 is a guide for guiding the wafer hand 403 horizontally as viewed in FIG. 4A. The prealignment stage 401 and the exposure stage 402 have a similar structure as that shown in FIG. 3, except that the electrostatic sensor 306 and the motor 308 are omitted and that the mechanism for driving the pawls 307 is modified such as described later.

Denoted at 406 is a shutter for controlling irradiation of the mask 402M with X-rays, and denoted at 413 is a shutter controller for controlling the operation of the shutter 406. More specifically, the controller 413 serves to control the shutter 406 so as to start X-ray irradiation after the positioning of the wafer upon the exposure stage 402 is completed. Denoted at 407 is a window having a beryllium thin film. Denoted at 408 is a light emission point of an SOR ring which provides an X-ray light source. The synchrotron radiation light (X-rays) emanates from the light emission point 408 substantially horizontally. Here, the synchrotron radiation light has a uniform intensity distribution in a direction (X direction) parallel to the orbit plane of the electron beam, whereas it has a symmetric intensity distribution in a direction (Y direction) perpendicular to the orbit plane. Cylindrical mirror 409 having a convex reflection surface serves to expand the X-ray bundle from the light emission point 408, in a direction (Y direction) in which the symmetric intensity distribution appears. The cylindrical mirror 409 is used to obtain an irradiation region of a necessary size, at the position at which the mask 402M and the wafer 305 (one exposure zone) are disposed.

As described, usually, the X-ray bundle from the SOR ring advances substantially horizontally. In consideration thereof, for irradiation of the wafer 305 with the X-rays, the exposure stage 402 is arranged to hold, by attraction, the wafer 305 with the wafer surface being placed vertically.

In FIGS. 4A-4C, the pawls 404 are fixed to the wafer hand 403 and, thus, they cannot be retracted. On the other hand, pawls 307 of the stages 401 and 402 can be protruded and retracted in accordance with the presence/absence of a wafer 305 on the wafer chuck 304, as in the FIG. 3 embodiment. These pawls are arranged to be held out of contact with a wafer unless it falls off. In this embodiment, an electrostatic sensor 306 of the preceding embodiment for wafer detection is not used. In place thereof, the pawls 307 are protruded by using the phenomenon that the back pressure of the wafer attraction vacuum increases if no wafer is placed on the wafer chuck 304.

Figure 5:
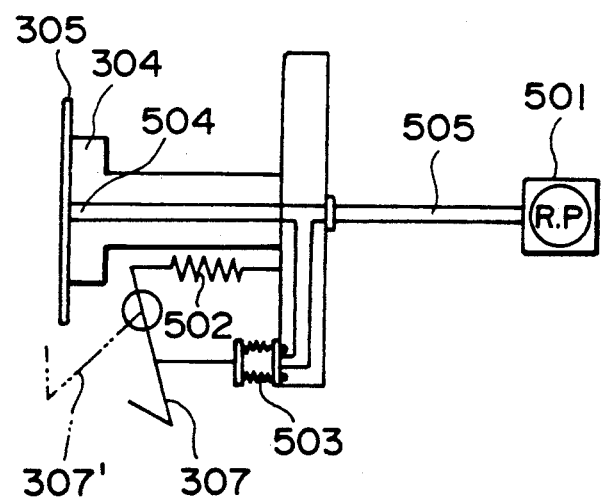
FIG. 5 is a schematic view of a wafer chuck used in the embodiment of FIGS. 4A–4D.

The actuator means effective to protrude the pawls 307 by using the phenomenon of increasing back pressure of the wafer attracting vacuum, may be structured such as shown in FIG. 5, for example. Denoted in FIG. 5 at 501 is a vacuum source such as a vacuum pump, for example; at 502 is a spring for urging the pawl 307 toward the wafer fall-off preventing position 307'; at 503 is a bellows; at 504 is an attracting bore; and at 505 is a vacuum supplying passageway. When the wafer 305 is held by the wafer chuck 304, the attracting bore 504 is covered by the wafer 305. Therefore, the pressure in the vacuum supplying passageway 505 is low. As a result, the bellows 504 inside of which is communicated with the vacuum supplying passageway 505 is contracted and, consequently, the pawl 307 is retracted by the bellows to its retracted position as depicted by a solid line. If the wafer 305 falls off the wafer chuck 304 due to electric service interruption, malfunction in the vacuum system, insufficient flatness of the wafer or for any other reason, the attracting bore 504 is uncovered. As a result, the pressure in the vacuum supplying passageway 505 increases suddenly. This causes extension of the bellows 504 and, as a consequence, the pawl 307 is urged by the biasing force of the spring 502 and is protruded to the wafer fall-off preventing position 307'. As shown in FIG. 4C, the wafer 305 which is just going to fall downwardly off the wafer chuck 304 slides downwardly by a small distance with its lower edge abutting against the slant portion 307a of the pawl 307, and it is stopped by a bent portion 307b of the pawl 307. In this manner, the lower edge of the wafer 305 is supported by the pawl 307, with the upper portion of the wafer leaning against the wafer chuck 304, whereby the fall-off of the wafer from the wafer chuck 304 is prevented. The bent portion 307b of the pawl 307 has a set angle, not to contact the surface of the wafer 305 as it supports the slid wafer. This effectively avoids damage of patterns on the wafer surface fallen off the wafer chuck 304. Therefore, the wafer can still be used for manufacture of semiconductor devices.

A further embodiment will now be explained. This embodiment corresponds to a modified form of the embodiment shown in FIGS. 4A-4D, and the actuator for driving the pawl 307 comprises a motor such as at 308 in FIG. 3. In an arrangement such as shown in FIGS. 4A-4C wherein a wafer is loaded in a direction facing the front, there is a possibility that the pawl 307 of the wafer chuck 304 side interferes with the wafer loading. If it actually interferes with the loading, the pawl 307 should be moved back to the retracted position during the loading operation.

Figure 6:
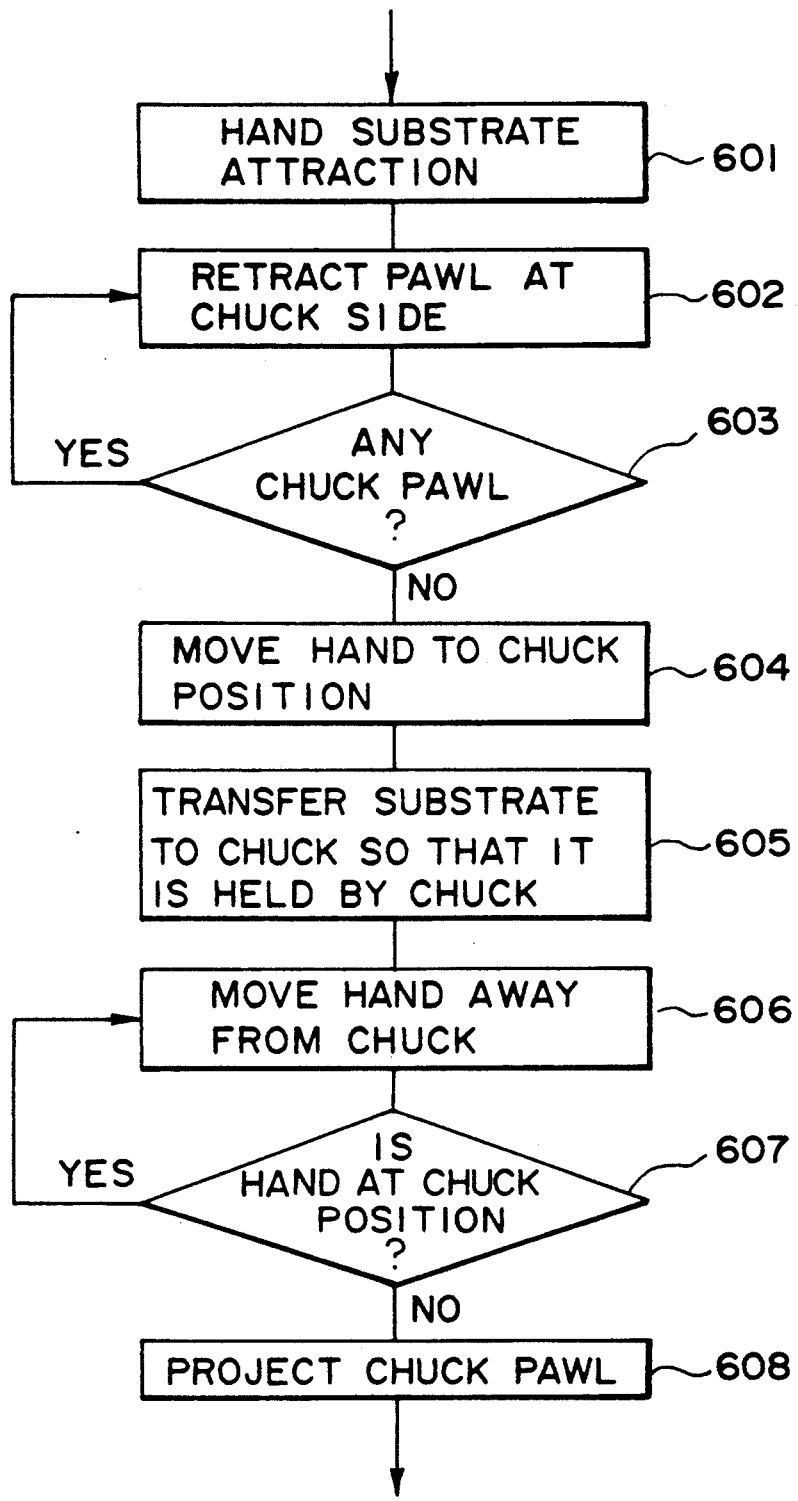
FIG. 6 is a flow chart for explaining the operation of an exposure apparatus according to a further aspect of the present invention.

FIG. 6 shows the sequence of a controller (not shown) for controlling the motor 308 for moving the pawl. More specifically, at the alignment stage 401 a wafer is attracted to the wafer hand 403 (step 601) and, immediately after this, the pawl 307 of the wafer chuck 304 at the exposure stage 402 side is moved back to its retracted position (step 602). During this period, the pawl of the alignment stage side is kept at its retracted position. After the retraction of the pawl 307 of the exposure stage side to the position not interfering with the loading is completed (step 603), the wafer hand 403 is moved to be faced with the wafer chuck 304 of the exposure stage 402 (step 604), and the wafer 305 is transferred from the wafer hand 403 to the wafer chuck 304 (step 605). Thereafter, the wafer hand 403 is moved away from the position of the wafer chuck 304 (step 606), and, after the wafer hand 403 reaches a position not interfering with the exposure process or the like (step 607), the pawl 307 of the wafer chuck 304 is projected to the fall-off preventing position. The pawl 307 of the wafer chuck is so formed that it does not contact the wafer unless the same falls off.

Subsequently, the shutter controller 413 operates to control the shutter 406 to start the X-ray exposure. A similar sequence as described above will be effected for the wafer loading from a different position to the alignment stage 401.

With the embodiments described hereinbefore, even if electric surface interruption or malfunction of a pump or a sensor occurs, damage to a substrate is effectively prevented. Further, damage to the pump or any other units in the apparatus by fractions of the substrate is effectively prevented.

It is to be noted here that the attraction of the substrate such as a wafer is not limited to vacuum attraction, and electrostatic attraction may be used as an example.

While the invention has been described with reference to the structures disclosed herein, it is not confined to the details set forth and this application is intended to cover such modifications or changes as may come within the purposes of the improvements or the scope of the following claims.

What is claimed is:

1. A device for holding a substrate, comprising:
   holding means for holding a substrate by attraction;
   guard means for preventing dropping of the substrate held by said holding means, said guard means being out of contact with the substrate when the substrate is held by said holding means;
   means for detecting presence/absence of the substrate at a substrate holding position on said holding means; and
   positioning means for positioning said guard means for the drop prevention in accordance with the detection by said detecting means.

2. A device according to claim 1, wherein said guard means comprises an openable and closeable pawl provided on said holding means.

3. A device according to claim 1, wherein said holding means comprises means for holding the substrate so that the surface of the substrate is inclined.

4. A device according to claim 3, wherein said holding means comprises means for holding the substrate vertically and means for conveying the substrate held vertically.

5. A device according to claim 4, wherein said holding means comprises means for first holding the substrate as it is placed horizontally and means for moving said holding means to place the substrate vertically, after said guard means is positioned for drop prevention.

6. A device according to claim 1, wherein said positioning means positions said guard means for drop prevention in response to a back pressure of vacuum attraction of said holding means.

7. A device according to claim 1, further comprising a substrate conveying mechanism and wherein said holding means comprises means for receiving the substrate from said substrate conveying hand mechanism and means for holding the received substrate by attraction, and wherein said positioning means positions said guard means for drop prevention after said hand mechanism moves away from said holding means.

8. A method of exposing a substrate with radiation, comprising the steps of:
conveying a substrate with a conveying hand mechanism while supporting the substrate so that the surface of the substrate is inclined;
receiving, by holding means, the substrate conveyed by the conveying hand mechanism;
moving the conveying hand mechanism away from the holding means;
moving, after the movement of the conveying hand mechanism away from the holding means, a guard means for preventing dropping of the substrate held by the holding means to a position for the drop prevention; and
irradiating the substrate, held by the holding means through attraction, with radiation being projected substantially horizontally.

9. A device for holding a substrate, comprising:
holding means having an attracting surface for attracting the substrate in a direction intersecting a direction in which the substrate could drop; and
guard means comprising a blocking member for blocking dropping of the substrate, said guard means comprising means for locating said blocking member out of contact with the substrate when the substrate is held by said holding means, and means for moving said blocking member to a position for blocking dropping of the substrate after the substrate is held by said holding means.

10. A device according to claim 9, wherein said blocking member comprises pawls which are movable relative to the substrate.

11. A device according to claim 9, wherein said guard means comprises means for moving said blocking member as a unit with said holding means in a direction of conveyance of the substrate.

12. A device according to claim 11, wherein said holding means comprises means for moving the substrate while keeping the surface of the substrate upright.

13. A device according to claim 12, wherein said holding means comprises means for starting attraction of the substrate while the attracting surface is positioned horizontally, and means for moving the attracting surface to an upright position after said guard means moves said blocking member to the position for blocking dropping of the substrate.

14. A device for holding a substrate, comprising:
holding means having an attracting surface for attracting the substrate in a direction intersecting a direction in which the substrate could drop;
detecting means for detecting presence/absence of the substrate; and
guard means comprising a blocking member for blocking dropping of the substrate, said guard means comprising means for locating said blocking member of contact with the substrate when the substrate is held by said holding means, and means for moving said blocking member to a position for blocking dropping of the substrate after the substrate is detected by said detecting means.

15. A device for holding a substrate, comprising:
holding means having an attracting surface for vacuum attracting the substrate in a direction intersecting a direction in which the substrate could drop; and
guard means comprising a blocking ember for blocking dropping of the substrate, said guard means comprising means for locating said blocking member out of contact with the substrate when the substrate is held by said holding means, and means for moving said blocking member to a position for blocking dropping of the substrate in accordance with the vacuum attraction.

16. A device for holding a substrate, comprising:
a hand mechanism for conveying the substrate;
a chuck having an attracting surface for attracting the substrate in a direction intersecting a direction in which the substrate could drop; and
guard means comprising a blocking member for blocking dropping of the substrate from said chuck, said guard means comprising means for locating said blocking member out of contact with the substrate when the substrate is held by said chuck, and means for moving said blocking member to a position for blocking dropping of the substrate after the substrate is transferred to said chuck by said hand mechanism.

17. An exposure apparatus, comprising:
a chuck having an attracting surface for attracting a substrate, said chuck holding the substrate so that the surface of the substrate is held substantially vertically;
illuminating means for illuminating the substrate with a radiation beam advancing substantially horizontally; and
guard means comprising a blocking member for blocking dropping of the substrate form said chuck, said guard means comprising means for locating said blocking member out of contact with the substrate when the substrate is held by said chuck, and means for moving said blocking member to a position for blocking dropping of the substrate after the substrate is held by said chuck.

18. An apparatus according to claim 17, wherein said illuminating means illuminates the substrate with synchrotron radiation containing X-rays.

19. A semiconductor device manufacturing method, comprising the steps of:
conveying a substrate with a conveying hand mechanism;

transferring the substrate from the conveying hand mechanism to a chuck;

holding the substrate with the chuck by attraction so that the surface of the substrate is held substantially vertically;

retracting the conveying hand mechanism;

moving a blocking member to a position effective to block dropping of the substrate; and exposing the substrate held by the chuck with a radiation beam advancing substantially horizontally.

* * * * *